US006859571B2

(12) United States Patent
Kimerling

(10) Patent No.: US 6,859,571 B2
(45) Date of Patent: Feb. 22, 2005

(54) HYBRID INTEGRATION OF ELECTRICAL AND OPTICAL CHIPS

(75) Inventor: Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 149 days.

(21) Appl. No.: 10/281,459

(22) Filed: Oct. 25, 2002

(65) Prior Publication Data

US 2003/0091264 A1 May 15, 2003

Related U.S. Application Data

(60) Provisional application No. 60/330,795, filed on Oct. 26, 2001.

(51) Int. Cl.[7] ................................................. G02B 6/12
(52) U.S. Cl. .............................. 385/14; 385/31; 385/36
(58) Field of Search .............................. 385/14, 31, 36

(56) References Cited

U.S. PATENT DOCUMENTS

| 4,514,748 | A |   | 4/1985  | Bean et al.           |
| 5,249,245 | A |   | 9/1993  | Lebby et al.          |
| 5,394,490 | A | * | 2/1995  | Kato et al. ..... 385/14 |
| 5,424,573 | A |   | 6/1995  | Kato et al.           |
| 6,107,618 | A |   | 8/2000  | Fossum et al.         |
| 6,125,217 | A |   | 9/2000  | Paniccia et al.       |
| 6,222,951 | B1|   | 4/2001  | Huang                 |
| 6,443,631 | B1| * | 9/2002  | Case et al. ..... 385/91 |
| 6,466,349 | B1| * | 10/2002 | Valley et al. ..... 398/182 |
| 6,512,861 | B2| * | 1/2003  | Chakravorty et al. ..... 385/14 |
| 6,674,948 | B2| * | 1/2004  | Yeh et al. ..... 385/120 |
| 6,692,979 | B2| * | 2/2004  | Yeh et al. ..... 438/27 |
| 6,718,079 | B1| * | 4/2004  | Gidon ..... 385/14 |

FOREIGN PATENT DOCUMENTS

| EP | 1 128 197   | 8/2001 |
| WO | WO 94/17557 | 8/1994 |

* cited by examiner

Primary Examiner—John R. Lee
Assistant Examiner—Paul M. Gurzo
(74) Attorney, Agent, or Firm—Gauthier & Connors LLP

(57) ABSTRACT

A system of integrating electronic and optical functions includes an electronic chip that also includes monolithic IC electronics for performing electronic functions. Furthermore, the electronic chip includes a plurality of solder bumps for receiving input for processing. An optical chip receives an optical signal and performs optical functions on the signal, and outputs electrical signals indicative of the optical functions performed on the signal. Moreover, the optical chip includes a plurality of solder bumps for sending the electrical signals as input to the electronic chip. The solder bumps of the electronic chip and optical chip are bonded to together so that a hybrid integration is formed that separates the yield of the optical and electrical circuits forming the electronic and optical chip.

24 Claims, 1 Drawing Sheet

HYBRID INTEGRATION OF ELECTRICAL AND OPTICAL CHIPS

PRIORITY INFORMATION

This application claims priority from provisional application Ser. No. 60/330,795 filed Oct. 26, 2001.

BACKGROUND OF THE INVENTION

The invention relates to the integration of an optical chip built-in waveguide/detectors to an electronic chip via flip chip bonding.

The processing of information in telecommunication and data communication systems are normally divided into optical transport through optical fiber and electrical signal processing. At the network level of the interconnection hierarchy, optical transport provides a high capacity pipe through wavelength division multiplexing of parallel streams of different colors of light in the same fiber. The interconnection bottleneck is in the distribution of signals to the end user. At the chip level of the hierarchy, higher densities of smaller wires limit performance by increasing the RC time delay. This delay limits clock signal distribution for global synchronization and input/output (I/O) bandwidth at all levels of interconnection. Optical interconnection has no such limits. It is therefore, necessary to migrate key signal distributions functions from the electrical to the optical regime.

SUMMARY OF THE INVENTION

According one aspect of the invention, there is provided a system of integrating electronic and optical functions. The system includes an electronic chip that also includes monolithic IC electronics for performing electronic functions. Furthermore, the electronic chip includes a plurality of solder bumps for receiving input for processing. An optical chip receives an optical signal and performs optical functions on the signal, and outputs electrical signals indicative of the optical functions performed on the signal. Moreover, the optical chip includes a plurality of solder bumps for sending the electrical signals as input to the electronic chip. The solder bumps of the electronic chip and optical chip are bonded to together so that a hybrid integration is formed that separates the yield of the optical and electrical circuits forming the electronic and optical chip.

According to another aspect of the invention, there is a method of integrating electronic and optical functions. The method includes providing an electronic chip that includes monolithic IC electronics for performing electronic functions. A plurality of solder bumps are formed on the electronic chip for receiving input for processing. The method also includes providing an optical chip that receives an optical signal and performs optical functions on the signal. The optical chip outputs electrical signals indicative of the optical functions performed on the signal. A plurality of solder bumps are formed on the optical chip for sending the electrical signals as input to the electronic chip. Furthermore, the method includes bonding the solder bumps of the electronic chip and optical chip together so that a hybrid integration is formed that separates the yield of the optical and electrical circuits forming the electronic and optical chip.

DETAILED DESCRIPTION OF THE INVENTION

Figure 1:
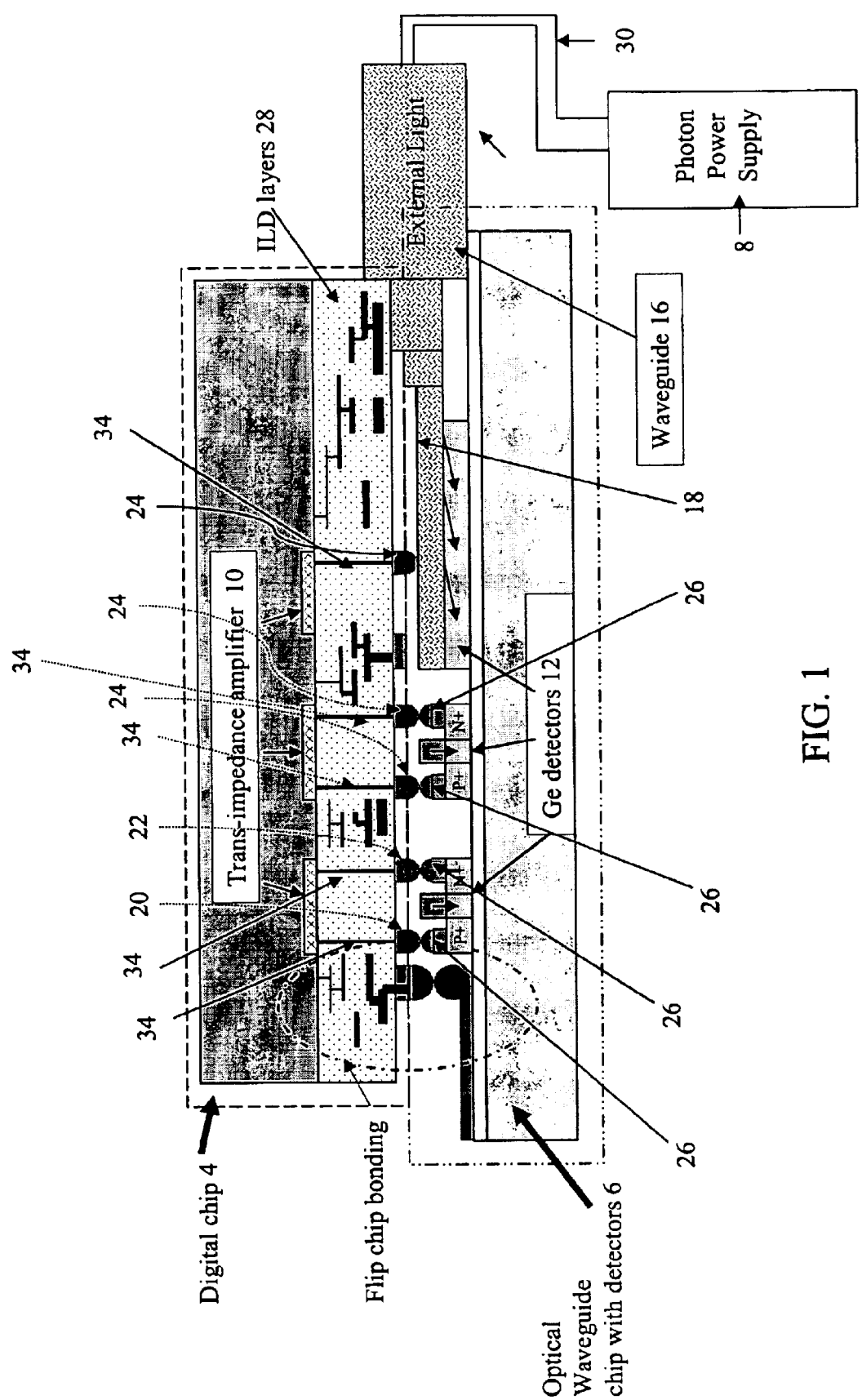
FIG. 1 is a schematic block diagram demonstrating the integration of an optical chip to an electronic chip via flip chip bonding.

The invention provides a technique to mate optical distribution waveguide circuits with electrical integrated circuits. This creates a platform for the partitioning of optical and electrical functions and the time evolution of a monolithic optical integrated circuit technology.

FIG. 1 is a schematic diagram demonstrating the integration of an optical chip to an electronic chip via flip chip bonding. As previously discussed, the system 2 separates the optical and electrical functions. The system 2 includes an electronic chip 4 and an optical chip 6, and is connected to a photon power supply 8. The photon power supply 8 can be a laser or a bank of lasers. All signals from the power supply 8 can be wavelength division multiplexed on one or few waveguides 30, and distributed by in line filters, such as microring resonators. The power supply 8 also provides wavelength division multiplexing of parallel streams on different colors of light. Furthermore, the optical waveguides 30 can distribute the photons with minimum latency and skew. One needs only to match the length of the waveguide distribution points, and no skew in timing results.

The electronic chip 4 contains the monolithic IC electronics. In particular, the electronic chip 4 includes various trans-impedance amplifiers 10, ILD layers 28, and several solder bumps 20 and 24. The electronic operations that are performed by the electronic chip 4 can vary depending the needs of the user. The trans-impedance amplifiers 10 are used to provide amplification of the signal received from either of the solder bumps 24, and interconnects with the solder bumps 24 through small wires 34. Once receiving the signal from their respective solder bumps 24, the trans-impedance amplifiers 10 filter and amplify the signal before sending it to the computational region of the electronic chip 4 for processing.

The ILD layers 28 provide an interface layer between the trans-impedance amplifiers 10 and the solder bumps 24, and are comprised of materials that allow the solder bumps 24 to be retained on the bottom region of the electronic chip 4. Moreover, the ILD layers 28 try to minimize the lost that can occur when a signal is provided from a solder bump to one of the trans-impedance amplifiers 10. In this embodiment, the ILD layers can span the entire length of the electronic chip 4, however, in other embodiments the length can include a smaller region depending on the size of the electronic chip 4, the size of the solder bumps 24, or the size of the trans-impedance amplifiers 10. Furthermore, the ILD layers 28 are formed using standard ILD deposition techniques in the art, such as CVD deposition processing or the like.

The optical chip 6 includes several Ge detectors 26, a general optical chip solder bump 22, and an optical waveguide element 14. The optical waveguide element 14 is connected to the photon power supply 8, and provides the photons supplied by the photon power supply 8 to the optical chip 6. Moreover, the optical waveguide element 14 is comprised of two portions 16 and 18. The first portion 16 is connected to the external photon power supply 8, and the second portion 18 is connected to internal elements of the optical chip 6, such as the Ge detectors 12. The dimensions of the first portion 16 are larger than the dimensions of the second portion 18 of the optical waveguide element 14 because of the average power associated with the photons supplied by the photon power supply 8. The second portion 18 is smaller because it provides the light to the optical elements within the optical chip 6. However, the dimensions of both the first 16 and second portion 18 can vary depending on the size of the optical chip 6, size of the optical elements, such as the Ge detectors 12, or the overall power considerations of the optical chip 6.

The Ge detectors 12 are formed on the optical chip 6, and have selected solder bumps 26 that are placed on the Ge detectors 12. Each of the Ge detectors 12 has a p and n region. The selected solder bumps 26 are bonded with the solder bumps 20 of the electronic chip 4. When the Ge detectors 12 receive an optical signal or light from the second portion 18 of the waveguide element, the Ge detectors 12 perform the necessary detection. Moreover, each of the Ge detectors 12 converts the optical signal into respective electrical signals. These electrical signals are supplied to their respective solder bumps 26 of the Ge detectors 12, where they are sent to the electronic chip 4 by way of the solder bumps 20.

The size of the Ge detectors 12 can vary depending the power considerations of the optical chip 6. Within the optical chip 6 there can be many Ge detectors 12 used. One of the limitations regarding the Ge detectors 12 can be the power requirement of the optical chip 6 and its size. However, other types of optical detectors can be used in accordance with the invention, and these optical detectors should allow for the construction of solder bumps so that bonding can be established with the solder bumps on in the electronic chip.

The size and shape of the solder bumps 26 on the Ge detectors 12 can also be based on the average power of the signal supplied to a solder bump by a Ge detector and the size of the optical chip 6.

The general optical chip solder bump 22 is bonded to a general electronic chip solder bump 20. These solder bumps 20 and 22 are not associated with either the Ge detectors 12 in the optical chip 6 or the trans-impedance amplifiers 10 in the electronic chip 4. The power stability and electrical maintenance of the optical chip 6 and electronic chip 4 are maintained by the general optical chip solder bump 22 and the general electronic chip solder bump 20, respectively. The general electronic chip solder bump 20 is placed directly on the ILD layers 28, and the general optical chip solder bump 22 is placed on the substrate region of the optical chip 6.

Other optical elements can also be used within the optical chip 6, such as optical modulators and add/drop filters. The sole limitation on these elements will be whether or not their outputs are provided to the electronic chip 4, and if so, these optical elements should allow for the placement of solder bumps. Also, the electronic chip 4 should have corresponding solder bumps for receiving the electrical signals from these optical elements.

The bonding of the optical chip 6 with the electronic chip 4 through their respective solder bumps 20, 22, 24, and 26 is called flip chip bonding.

The flip chip bonding approach separates the optical and electronic functions. The light sources are preferably off chip for simplicity, but not necessarily. By creating a photon distribution system using a monolithic process technology, alignment is a mask-mediated pattern transfer process, not a pick and place process. The two chips 4 and 6 are combined to transmit only electrical signals through a standard solder bump process, as previously described.

Matching patterns of solder bumps 20, 22, 24 and 26 on each chip 4 or 6 make electrode alignment a non-issue. Limits on the inventive concept can be skin effects that expel current from conductors at high frequency. However, these effects are not expected to be important below 50 GHz. The short length and large diameter of the solder bumps should remove any resistance and capacitance limits in the frequency response. This platform for hybrid integration separates the yield of the optical and electrical circuits, and does not depend on free space light access to active devices on the electronic chip. Also, it allows for migration of complexity across the interconnect hierarchy.

Applications for the invention can be, for example, global clocking on chip and chip-to-chip using an external optical pulse source and photodetectors, I/O using many colors of light from off chip, or photodetectors and modulators driven by transistors on the IC side of the solder bumps.

Although the present invention has been shown and described with respect to several preferred embodiments thereof, various changes, omissions and additions to the form and detail thereof, may be made therein, without departing from the spirit and scope of the invention.

What is claimed is:

1. A system of integrating electronic and optical functions comprising:
   an electronic chip that includes monolithic IC electronics for performing electronic functions and a plurality of trans-impedance amplifiers, said electronic chip including a plurality of solder bumps for receiving input for processing, said trans-impedance amplifiers are coupled to a selective number of said solder bumps by way of small wires, wherein ILD layers are interposed between the solder bumps of the electronic chip and said trans-impedance amplifiers; and
   an optical chip that receives an optical signal and performs optical functions on said signal, wherein said optical chip outputs electrical signals indicative of the optical functions performed on the signal, said optical chip including a plurality of solder bumps for sending said electrical signals as input to said electronic chip;
   wherein the solder bumps of said electronic chip and said optical chip are bonded to together so that a hybrid integration is formed that separates the yield of the optical and electrical circuits forming said electronic and optical chip.

2. The system of claim 1 further comprising a photon supply source for generating said optical signal.

3. The system of claim 2, wherein said optical chip comprises of one or more optical elements.

4. The system of claim 3, wherein said one or more optical elements are Ge detectors.

5. The system of claim 4, wherein said Ge detector is coupled to solder bumps that are bonded with said solder bumps of said electronic chip.

6. The system of claim 5, wherein said one or more optical elements are modulators.

7. The system of claim 3, wherein said one or more optical elements are add/drop filters.

8. The system of claim 3, wherein said one or more optical elements is an optical waveguide.

9. The system of claim 8, wherein said optical waveguide comprises of a first and second portion.

10. The system of claim 9, wherein said first portion is coupled to a photon power supply and said second portion is coupled to said optical waveguide.

11. The system of claim 10, wherein said second portion is coupled to said one or more optical elements and said first portion.

12. The system of claim 10, wherein said photon power supply provides wavelength division multiplexing of parallel streams on different colors of light.

13. A method of integrating electronic and optical functions comprising:

providing a electronic chip that includes monolithic IC electronics for performing electronic functions and a plurality of trans-impedance amplifiers, forming on said electronic chip a plurality of solder bumps for receiving input for processing;

coupling said trans-impedance amplifiers to a selective number of said solder bumps by way of small wires, wherein ILD layers are interposed between the solder bumps of the electronic chin and said trans-impedance amplifiers;

providing an optical chip that receives an optical signal and performs optical functions on said signal, wherein said optical chip outputs electrical signals indicative of the optical functions performed on the signal;

forming on said optical chip a plurality of solder bumps for sending said electrical signals as input to said electronic chip; and bonding the solder bumps of said electronic chip and optical chip together so that a hybrid integration is formed that separates the yield of the optical and electrical circuits forming said electronic and optical chip.

14. The method of claim 13 further comprising generating said optical signal.

15. The method of claim 14, wherein said optical chip comprises one or more optical elements.

16. The method of claim 15, wherein said one or more optical elements are Ge detectors.

17. The method of claim 16, wherein said Ge detector is coupled to solder bumps that are bonded with said solder bumps of said electronic chip.

18. The method of claim 17, wherein said one or more optical elements are modulators.

19. The method of claim 15, wherein said one or more optical elements are add/drop filters.

20. The method of claim 15, wherein said one or more optical elements is an optical waveguide.

21. The method of claim 20, wherein said optical waveguide comprises a first and second portions.

22. The method of claim 21, wherein said first portion is coupled to a photon power supply and said second portion is coupled to said optical waveguide.

23. The method of claim 22, wherein said second portion is coupled to said one or more optical elements and said first portion.

24. The method of claim 22, wherein said photon power supply provides wavelength division multiplexing of parallel streams on different colors of light.

* * * * *